United States Patent
Mei et al.

(10) Patent No.: US 10,027,134 B2
(45) Date of Patent: Jul. 17, 2018

(54) ACTIVE EQUALIZATION METHOD AND SYSTEM OF LITHIUM IRON PHOSPHATE BATTERY PACK

(71) Applicants: Qinghai Contemporary Amperex Technology Limited, Xining (CN); Ningde Contemporary Amperex Technology Limited, Ningde (CN)

(72) Inventors: Jingyao Mei, Ningde (CN); Jianguo Hu, Ningde (CN); Shilin Huang, Ningde (CN)

(73) Assignees: Qinghai Contemporary Amperex Technology Limited, Xining (CN); Ningde Contemporary Amperex Technology Limited, Ningde (CN)

( * ) Notice: Subject to any disclaimer, the term of this patent is extended or adjusted under 35 U.S.C. 154(b) by 253 days.

(21) Appl. No.: 15/015,942

(22) Filed: Feb. 4, 2016

(65) Prior Publication Data

US 2016/0233696 A1    Aug. 11, 2016

(30) Foreign Application Priority Data

Feb. 5, 2015    (CN) .......................... 2015 1 0060954

(51) Int. Cl.
*H01M 10/0525*    (2010.01)
*H02J 7/00*    (2006.01)
(Continued)

(52) U.S. Cl.
CPC .......... *H02J 7/0014* (2013.01); *H02J 7/0021* (2013.01); *H02J 7/0047* (2013.01);
(Continued)

(58) Field of Classification Search
CPC ...... H02J 7/0014; H02J 7/0021; H02J 7/0047; H02J 2007/005; G01R 31/362;
(Continued)

(56) References Cited

U.S. PATENT DOCUMENTS

| | | | | |
|---|---|---|---|---|
| 2010/0194339 A1* | 8/2010 | Yang | .................... | H02J 7/0016 320/116 |
| 2013/0179061 A1* | 7/2013 | Gadh | .................. | B60L 11/1842 701/123 |

(Continued)

FOREIGN PATENT DOCUMENTS

| CN | 101692508 A | 4/2010 |
|---|---|---|
| CN | 101740827 A | 6/2010 |

(Continued)

OTHER PUBLICATIONS

Office Action for related Chinese Patent Application 201510060954.6 dated Jul. 13, 2016 and its English translation.
(Continued)

*Primary Examiner* — Drew A Dunn
*Assistant Examiner* — Sailesh Thapa
(74) *Attorney, Agent, or Firm* — Ladas & Parry, LLP

(57) ABSTRACT

The present application relates to an active equalization method and system of a lithium iron phosphate (LFP) battery pack. The method includes the following steps of: determining, for each cell in the LFP battery pack, a voltage range in which a State of Charge (SoC) can be accurately queried, and determining a corresponding relation between a voltage at which the SoC can be accurately queried and the SoC; sampling an open circuit voltage of each cell in the LFP battery pack in a quiescent state; judging whether the open circuit voltage is within the voltage range in which the SoC can be accurately queried; if the open circuit voltage is within the voltage range in which the SoC can be accurately queried, acquiring the SoC of a cell corresponding to the open circuit voltage according to the open circuit voltage and the corresponding relation between the voltage at which the SoC can be accurately queried and the SoC, and determining an equalized capacity of each cell according to the SoC of each cell; performing active equalization processing (Continued)

on the LFP battery pack based on the equalized capacities of respective cells in the LFP battery pack.

12 Claims, 7 Drawing Sheets

(51) Int. Cl.
$H01M\ 10/42$ (2006.01)
$H01M\ 4/58$ (2010.01)
$G01R\ 31/36$ (2006.01)

(52) U.S. Cl.
CPC ........ $G01R\ 31/362$ (2013.01); $G01R\ 31/3658$ (2013.01); $H01M\ 4/5825$ (2013.01); $H01M\ 10/0525$ (2013.01); $H01M\ 2010/4271$ (2013.01); $H02J\ 2007/005$ (2013.01)

(58) Field of Classification Search
CPC ............ G01R 31/3658; H01M 4/5825; H01M 10/0525; H01M 2010/4271
USPC ........................................................ 320/118
See application file for complete search history.

(56) References Cited

U.S. PATENT DOCUMENTS

| | | | | |
|---|---|---|---|---|
| 2015/0137763 | A1* | 5/2015 | Kikuchi | B60L 11/1861 320/118 |
| 2016/0351976 | A1* | 12/2016 | Kawahara | H01M 10/48 |
| 2017/0005488 | A1* | 1/2017 | Suzuki | B60L 11/1861 |

FOREIGN PATENT DOCUMENTS

| | | |
|---|---|---|
| CN | 102255114 A | 11/2011 |
| CN | 102361100 A | 2/2012 |
| CN | 101794921 A | 8/2013 |
| JP | 2004031012 A | 1/2004 |
| JP | 2005341645 A | 12/2005 |
| JP | 2010045963 A | 2/2010 |
| WO | 2012160638 A1 | 11/2012 |

OTHER PUBLICATIONS

Japanese Office Action dated Feb. 14, 2017 for Japanese Patent Application No. 2016-020895 with English translation from JPO.

* cited by examiner

±5mV sampling error, 3% SoC error threshold

ACTIVE EQUALIZATION METHOD AND SYSTEM OF LITHIUM IRON PHOSPHATE BATTERY PACK

CROSS-REFERENCE TO RELATED APPLICATIONS

This application claims the benefit of and priority to Chinese Patent Application No. 201510060954.6 filed on Feb. 5, 2015, the disclosure of which is incorporated herein by reference.

TECHNICAL FIELD

The present application relates to the technical field of batteries, and in particular to an active equalization method and system of a lithium iron phosphate (LFP) battery pack.

BACKGROUND

Lithium iron phosphate (LFP) batteries are environment-friendly batteries. Compared to common lithium batteries, LFP batteries have advantages such as high safety, long cycle life, fast charge and discharge, lower weight with the same energy density and high temperature performance, and thus have favorable application prospect. For example, LFP battery packs can be applied to Electric Vehicles (EVs), Energy Storage Systems (ESSs) and the like. Common applications include electric bicycles, electric buses and the like.

An LFP battery pack is formed of multiple individual cells connected in series. Due to restrictions from manufacturing processes, there are deviations between cells, and during their use, these cells may have different self-discharges due to an increase in the number of charge-discharge cycles and impacts from storage time, temperature and the like, therefore cells in the same battery pack have different States of Charge (SoCs), thereby resulting in unequalization of cells in the same battery pack. SoC is also referred to as remaining capacity, which indicates a ratio of a remaining capacity after a battery is used for a period of time or is put aside for a long time to a capacity when the battery is fully charged, and which is expressed in percentage. SoC has a range of 0 to 1, and when SoC=0, it represents that the battery is fully discharged, and when SoC=1, it represents that the battery is fully charged.

Such non-equalization for an LFP battery pack may reduce performance of the LFP battery pack, and the life time of the LFP battery pack will be shortened. Therefore, the LFP battery pack needs to be equalized so that differences in SoCs between respective cells in the LFP battery pack are within a certain error range.

SUMMARY OF THE INVENTION

The present disclosure is intended to provide an active equalization method and system for a lithium iron phosphate (LFP) battery pack, which can improve the performance of the LFP battery pack and extend the life time of the LFP battery pack.

To this end, the present disclosure provides an active equalization method of an LFP battery pack, which includes the following steps of:

determining, for each cell in the LFP battery pack, a voltage range in which a State of Charge (SoC) can be accurately queried, and determining a corresponding relation between a voltage at which the SoC can be accurately queried and the SoC;

sampling an OCV (open circuit voltage) of each cell in the LFP battery pack in a quiescent state;

judging whether the open circuit voltage is within the voltage range in which the SoC can be accurately queried;

if the open circuit voltage is within the voltage range in which the SoC can be accurately queried, acquiring the SoC of a cell corresponding to the open circuit voltage according to the open circuit voltage and the corresponding relation between the voltage at which the SoC can be accurately queried and the SoC, and determining an equalized capacity of each cell according to the SoC of each cell, wherein the equalized capacity of a cell is equal to a difference between a capacity of each cell and a minimum of capacities of all cells in the LFP battery pack, and the capacity of a cell is equal to a product of a rated capacity of the cell and the SoC of the cell;

performing active equalization processing on the LFP battery pack based on the equalized capacities of respective cells in the LFP battery pack.

Further, the active equalization method of an LFP battery pack further includes:

updating a current equalized capacity of a cell according to an equalized capacity of the cell prior to a previous active equalization and a compensation capacity and/or discharge capacity of the cell during the previous active equalization, wherein the current equalized capacity of the cell=the equalized capacity of the cell prior to the previous active equalization+the compensation capacity of the cell during the previous active equalization−the discharge capacity of the cell during the previous active equalization;

then the active equalization processing includes: performing active equalization processing on the LFP battery pack based on updated current equalized capacity of the cell in the LFP battery pack.

Further, before the step of updating a current equalized capacity of a cell according to an equalized capacity of the cell prior to a previous active equalization and a compensation capacity and/or discharge capacity of the cell during the previous active equalization, the active equalization method of an LFP battery pack further includes:

judging continuously whether the equalized capacities of respective cells in the LFP battery pack are all equal to 0, and if the equalized capacity of at least one cell in the LFP battery pack is not equal to 0, judging whether the LFP battery pack is in a quiescent state and whether the open circuit voltage sampled in real time is within the voltage range in which an SoC can be accurately queried; in a case where the equalized capacities of respective cells in the LFP battery pack are all equal to 0, proceeding to judge until the equalized capacity of at least one cell in the LFP battery pack is not equal to 0;

if the LFP battery pack is not in a quiescent state or the open circuit voltage sampled in real time is not within the voltage range in which an SoC can be accurately queried, implementing the following step of: updating a current equalized capacity of a cell according to an equalized capacity of the cell prior to a previous active equalization and a compensation capacity and/or discharge capacity of the cell during the previous active equalization.

Further, the active equalization method of an LFP battery pack further includes:

if the LFP battery pack is in a quiescent state and the open circuit voltage sampled in real time is not within the voltage range in which an SoC can be accurately queried, implementing the following steps of: acquiring an SoC of a cell corresponding to an open circuit voltage sampled in real time according to the open circuit voltage sampled in real time and the corresponding relation between a voltage at which the SoC can be accurately queried and the SoC, and determining the equalized capacity of each cell according to the SoC of each cell corresponding to the open circuit voltage sampled in real time.

Further, the step of determining equalized capacity of each cell according to the SoC of each cell includes the following steps of:

acquiring an SoC difference of each cell in the LFP battery pack, wherein the SoC difference is equal to a difference between the SoC of a cell and a minimum SoC, and the minimum SoC is a minimum of SoCs of all cells in the LFP battery pack;

determining the equalized capacity of a corresponding cell according to the SoC difference, wherein the equalized capacity of the cell is equal to a product of a rated capacity of the cell and the SoC difference of the cell.

Further, the step of performing active equalization processing on the LFP battery pack based on the equalized capacity of each cell in the LFP battery pack includes:

comparing an average voltage of the LFP battery pack with a preset voltage threshold;

if the average voltage of the LFP battery pack is smaller than the voltage threshold, performing compensation equalization on M cells with smallest equalized capacities in the LFP battery pack, where M is a natural number;

if the average voltage of the LFP battery pack is greater than the voltage threshold, performing compensation equalization on the M cells with smallest equalized capacities in the LFP battery pack, and/or performing discharge equalization on Q cells with greatest equalized capacities in the LFP battery pack, where Q is a natural number.

Further, the voltage range in which an SoC can be accurately queried is a union set of a voltage interval from 2710 mV to 3283 mV and a voltage interval from 3299 mV to 3317 mV.

The active equalization method of an LFP battery pack according to embodiments of the present invention uses an accurate SoC difference as a basis for equalization, and carries out different equalization operations at two moments when the LFP battery pack is within a high voltage interval and a low voltage interval so that equalization judging and implementation are not necessarily to be carried out simultaneously. Furthermore, the active equalization method of an LFP battery pack according to embodiments of the present invention separates screening of decision basis from implementation of equalization operations so that reliability of the decision is improved and equalization can be implemented on any occasion. The active equalization method of an LFP battery pack according to embodiments of the present disclosure can improve the performance of the LFP battery pack and extend the life time of the LFP battery pack.

To this end, the present disclosure provides an active equalization system of an LFP battery pack, which includes a storage module, a sampling module, a judging module, a determination module and an equalization module, wherein, the storage module is configured to store a corresponding relation between a voltage at which an States of Charge (SoC) can be accurately queried and the SoC;

the sampling module is configured to sample an open circuit voltage of each cell in the LFP battery pack in a quiescent state;

the judging module is configured to judge whether the open circuit voltage is within a voltage range in which the SoC can be accurately queried;

the determination module is configured to acquire an SoC of a cell corresponding to the open circuit voltage according to the open circuit voltage and the corresponding relation between a voltage at which the SoC can be accurately queried and the SoC when the open circuit voltage is within the voltage range in which the SoC can be accurately queried, and determine an equalized capacity of each cell according to the SoC of each cell, wherein the equalized capacity of each cell is equal to a difference between a capacity of each cell and a minimum of capacities of all cells in the LFP battery pack, and the capacity of a cell is equal to a product of a rated capacity of the cell and the SoC of the cell;

the equalization module is configured to perform active equalization processing on the LFP battery pack based on the equalized capacities of respective cells in the LFP battery pack.

Further, the active equalization system of an LFP battery pack further includes an updating module configured to update a current equalized capacity of a cell according to an equalized capacity of the cell prior to a previous active equalization and a compensation capacity and/or discharge capacity of the cell during the previous active equalization, wherein the current equalized capacity of the cell=the equalized capacity of the cell prior to the previous active equalization+the compensation capacity of the cell during the previous active equalization−the discharge capacity of the cell during the previous active equalization; the equalization module is further configured to perform active equalization processing on the LFP battery pack based on updated current equalized capacities of respective cells in the LFP battery pack.

Further, the active equalization system of an LFP battery pack further includes: a first judging module configured to judge continuously whether the equalized capacities of respective cells in the LFP battery pack are all equal to 0; a second judging module configured to, when a judging result of the first judging module is that the equalized capacity of at least one cell in the LFP battery pack is not equal to 0, judge whether the LFP battery pack is in a quiescent state and whether the open circuit voltage sampled in real time is within the voltage range in which an SoC can be accurately queried; and when the judging result of the second decision is that the LFP battery pack is not in a quiescent state or the open circuit voltage sampled in real time is not within the voltage range in which an SoC can be accurately queried, notify the updating module to update the current equalized capacity of the cell according to the equalized capacity of the cell prior to the previous active equalization and the compensation capacity and/or discharge capacity of the cell during the previous active equalization.

Further, the second judging module is configured to, when the judging result is that the LFP battery pack is in a quiescent state and the open circuit voltage sampled in real time is not within the voltage range in which an SoC can be accurately queried, notify the determination module to acquire the SoC of a cell corresponding to the open circuit voltage sampled in real time according to the open circuit voltage sampled in real time and the corresponding relation between the voltages at which the SoC can be accurately queried and the SoC, and to determine the equalized capacity of each cell according to the SoC of each cell corresponding to the open circuit voltage sampled in real time.

Further, the determination module includes:

an acquisition unit configured to acquire an SoC difference of each cell in the LFP battery pack, wherein the SoC difference is equal to a difference between the SoC of each cell and a minimum SoC, and the minimum SoC is a minimum of SoCs of all cells in the LFP battery pack;

a determination unit configured to determine, according to each of the SoC differences, the equalized capacity of a corresponding cell, which is equal to a product of a rated capacity of the cell and the SoC difference of the cell.

Further, the equalization module includes:

a comparison unit configured to compare an average voltage of the LFP battery pack with a preset voltage threshold;

a first equalization unit configured to, when the average voltage of the LFP battery pack is smaller than the voltage threshold, perform compensation equalization on M cells with smallest equalized capacities in the LFP battery pack, where M is a natural number;

a second equalization unit configured to, when the average voltage of the LFP battery pack is greater than the voltage threshold, perform compensation equalization on the M cells with smallest equalized capacities in the LFP battery pack, and/or perform discharge equalization on Q cells with greatest equalized capacities in the LFP battery pack, where Q is a natural number.

Further, the voltage range in which an SoC can be accurately queried is a union set of a voltage interval from 2710 mV to 3283 mV and a voltage interval from 3299 mV to 3317 mV.

The active equalization system of an LFP battery pack according to embodiments of the present invention uses an accurate SoC difference as a basis for equalization, and carries out different equalization operations at two moments when the LFP battery pack is within a high voltage interval and a low voltage interval so that equalization judging and implementation are not necessarily to be carried out simultaneously. Furthermore, the active equalization system of an LFP battery pack according to embodiments of the present invention separates screening of decision basis from implementation of equalization operations so that reliability of the decision is improved and equalization can be implemented on any occasion. The active equalization system of an LFP battery pack according to embodiments of the present disclosure can improve the performance of the LFP battery pack and extend the life time of the LFP battery pack.

SPECIFIC EMBODIMENTS

The main idea of the present invention lies in: an accurate SoC difference is used as a basis for equalization, and different equalization operations are performed at two moments when the LFP battery pack is within a high voltage interval and a low voltage interval so that screening of decision basis is separated from implementation of equalization operations, and equalization judging and implementation are not necessarily to be carried out simultaneously.

The principle and features of the present invention will be described below with reference to accompanying drawings, and embodiments illustrated are for explanation of the present invention only and are not intended to limit the scope of the present invention. For those skilled in the art, all embodiments acquired from spirits of the present invention without any inventive work shall fall into the scope of protection of the present invention.

Figure 1:
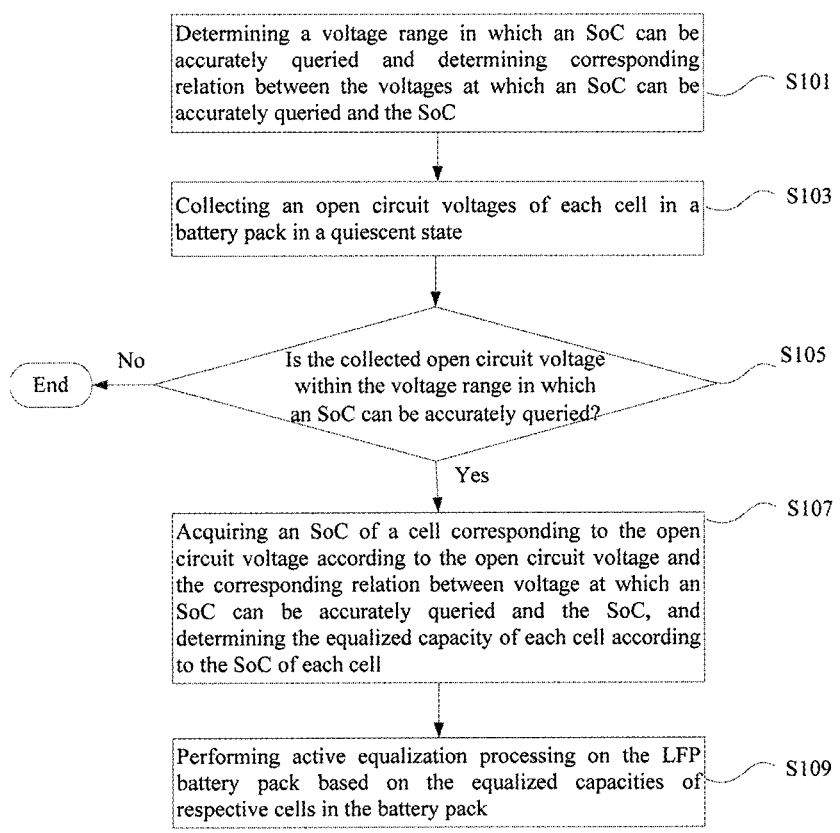
FIG. 1 is a flow chart of an active equalization method of an LFP battery pack according to an embodiment of the present invention.

FIG. 1 is a flow chart of an active equalization method of an LFP battery pack according to an embodiment of the present invention. As shown in FIG. 1, in the present embodiment, the active equalization method of an LFP battery pack may include the following steps:

In step S101, a voltage range in which an SoC can be accurately queried for each cell in the LFP battery pack is determined, and a corresponding relation between a voltage at which the SoC can be accurately queried and the SoC is determined.

In an embodiment, the voltage range in which an SoC can be accurately queried can be determined from three factors including a characteristic curve of a cell, a voltage sampling accuracy and an SoC error threshold. The way to determine the voltage range in which an SoC can be accurately queried will be described briefly with reference to FIG. 2 and FIG. 3.

Figure 2:
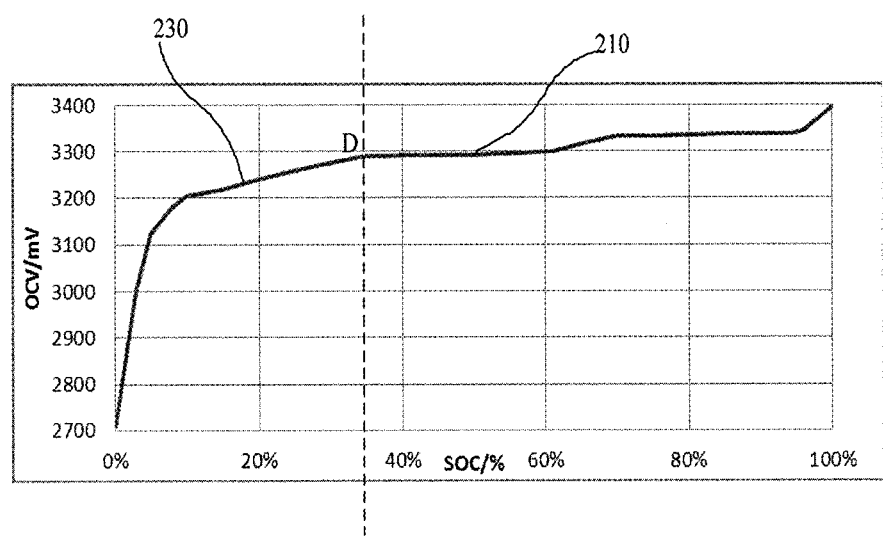
FIG. 2 shows a characteristic curve of an LFP cell.
Figure 3:
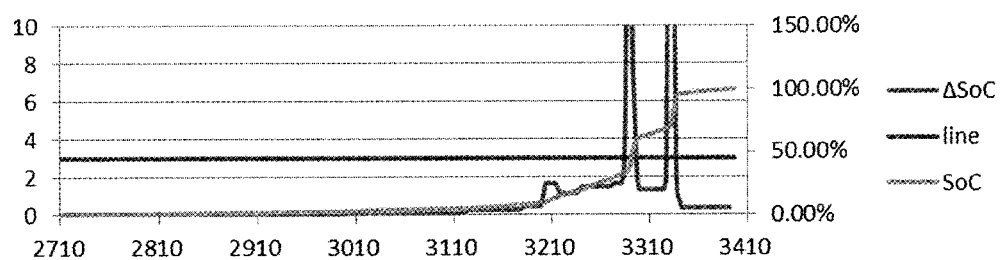
FIG. 3 is a graph for determining a voltage range in which SoCs can be accurately queried that is obtained from analysis of a characteristic curve of a cell with a voltage sampling accuracy of ±5 mV and an SoC error threshold of 3%.

FIG. 2 shows a characteristic curve of an LFP cell; FIG. 3 is a graph for determining a voltage range in which an SoC can be accurately queried that is obtained from analysis of the characteristic curve of the cell in FIG. 2 with a voltage sampling accuracy of ±5 mV and an SoC error threshold of 3%. In FIG. 3, "line" represents a desired error threshold. Referring to FIG. 2 and FIG. 3, it can be seen that in voltage intervals from 2710 micro Volt (mV) to 3283 mV and from 3299 mV to 3317 mV, values of SoCs can be accurately queried according to open circuit voltages based on corresponding relations between open circuit voltages and SoCs. Thus, a union set of the voltage interval from 2710 mV to 3283 mV and the voltage interval from 3299 mV to 3317 mV is the voltage range in which an SoC can be accurately queried. The above voltage range in which an SoC can be accurately queried can be determined together from three factors including a characteristic curve of a cell, a voltage sampling accuracy and an SoC error threshold, and a correspondence table for open circuit voltages at which SoCs can be accurately queried and SoCs can be used to record corresponding relations between voltages at which SoC can be accurately queried and SoCs.

It should be noted that though characteristic curves of LFP batteries are similar, different formulas of cells of the LPF battery will change the characteristic curve of the cell and result in changes in parameters, thus the above parameters are for illustration only.

In addition, when materials, manufacturing processes of respective cells are the same, they will have the same characteristic curve, thus respective cells have the same voltage range in which an SoC can be accurately queried, i.e., all cells in the LFP battery pack may have the same correspondence table for open circuit voltages at which SoCs can be accurately queried and SoCs. In an embodiment, the corresponding relations between voltages in which SoCs can be accurately queried and SoCs can also be represented by a non-plateau zone 230 in FIG. 2.

In step S103, an open circuit voltages of each cell in the LFP battery pack in a quiescent state is sampled;

In an embodiment, the step S103 specifically includes: judging whether the LFP battery pack is in a quiescent state; if the LFP battery pack is in a quiescent state, sampling the open circuit voltage of each cell in the LFP battery pack.

In an embodiment, the step of judging whether the LFP battery pack is in a quiescent state may include: judging whether the current of the LFP battery pack is smaller than 0.03 Coulomb (C) or smaller than 3 Ampere (A) and lasts for more than 30 minutes (min); if yes, determining that the LFP battery pack is in a quiescent state.

In step S105, whether the sampled open circuit voltage is within the voltage range in which an SoC can be accurately queried is judged, and if the sampled open circuit voltage is within the voltage range in which an SoC can be accurately queried, proceed to step S107, otherwise, the process ends;

In step S107, an SoC of a cell corresponding to the open circuit voltage according to the open circuit voltage and the corresponding relation between the voltage at which the SoC can be accurately queried and the SoC are acquired, and the equalized capacity of each cell is determined according to the SoC of each cell, wherein the equalized capacity of each cell is equal to the difference between the capacity of each cell and a minimum of capacities of all cells in the LFP battery pack, and the capacity of a cell is equal to the product of a rated capacity of the cell and the SoC of the cell;

In an embodiment, the step of determining the equalized capacity of each cell according to the SoC of each cell in step S107 may include the following steps:

acquiring an SoC difference of each cell in the LFP battery pack, wherein the SoC difference is equal to a difference between the SoC of each cell and a minimum SoC, and the minimum SoC is a minimum of SoCs of all cells in the LFP battery pack; acquiring the equalized capacity of a corresponding cell according to the SoC difference, wherein the equalized capacity of the cell is equal to the product of the rated capacity of the cell and the SoC difference of the cell.

If the SoC of the $x^{th}$ cell in the LFP battery pack is set to be $SoC(x)$ and a minimum of SoCs of all cells in the LFP battery pack is set to be $SoC_{min}$, a difference $\Delta SoC(x)$ between $SoC(x)$ and $SoC_{min}$ is namely the SoC difference of the $x^{th}$ cell in the LFP battery pack, $\Delta SoC(x)=SoC(x)-SoC_{min}$.

The capacity of the $x^{th}$ cell in the LFP battery pack is set to be $Cap(x)$, the capacity desired to be equalized for the $x^{th}$ cell is set to $\Delta Cap(x)$, then $\Delta Cap(x)$=rated capacity of the $x^{th}$ cell*$\Delta SoC(x)$, where the symbol "*" in the equation is a multiplication sign.

In step S109, active equalization processing is performed on the LFP battery pack based on the equalized capacities of respective cells in the LFP battery pack.

Specifically, the step of performing active equalization processing on the LFP battery pack may include the following steps:

comparing an average voltage of the LFP battery pack with a preset voltage threshold, if the average voltage of the LFP battery pack is smaller than the voltage threshold, performing compensation equalization on M cells with smallest equalized capacities in the LFP battery pack, where M is a natural number;

if the average voltage of the LFP battery pack is greater than the voltage threshold, performing compensation equalization on the M cells with smallest equalized capacities in the LFP battery pack, and/or performing discharge equalization on Q cells with great equalized capacities in the LFP battery pack, where Q is a natural number.

Wherein, the voltage threshold is used to artificially divide the voltage of the entire LFP battery pack into a high voltage interval and a low voltage interval. Generally, an inflection point of the average voltage of cells in the LFP battery pack in a plateau zone and a non-plateau zone is regarded as the voltage threshold that is denoted by Vg. When the average voltage of cells in the LFP battery pack is greater than Vg, it is considered that the LFP battery pack is in the high voltage interval, otherwise, it is in the low voltage interval. That is to say, the active equalization processing performed on the LFP battery pack may include two occasions: when the LFP battery pack is in the high voltage interval, compensation equalization may be only performed on a part of cells in the LFP battery pack, or discharge equalization may be only performed on a part of cells in the LFP battery pack, or compensation equalization may be performed on a part of cells in the LFP battery pack and simultaneously discharge equalization is performed on another part of cells in the LFP battery pack; and when the LFP battery pack is in the low voltage interval, compensation equalization may be performed only on a part of cells in the LFP battery pack.

In an embodiment, the voltage threshold can be determined by using the following steps:

a plateau zone 210 and a non-plateau zone 230 are divided in a characteristic curve in FIG. 2, an inflection point voltage at the inflection point D between the non-plateau zone 230 and the plateau zone 210 is obtained and denoted as $V_D$; the voltage threshold Vg is calculated from the voltage at the inflection point $V_D$ and a corresponding offset according to an equation $Vg=V_D+offset$;

wherein the offset can be calculated from the sampling error, SoC conversion error, and capacity error after equalization for a short time. In an embodiment, the offset can be 50 mV.

When the equalized capacities of respective cells are 0, the equalization ends.

The active equalization method of an LFP battery pack according to embodiments of the present invention uses accurate SoC differences as basis for equalization, and carries out different equalization operations at two occasions when the LFP battery pack is within a high voltage interval and a low voltage interval so that equalization decision and implementation are not necessarily to be carried out simultaneously. Furthermore, the active equalization method of an LFP battery pack according to embodiments of the present invention separates screening of decision basis from implementation of equalization operations so that reliability of the decision is improved and equalization can be implemented on any occasion. The active equalization method of an LFP battery pack according to the embodiments of the present invention can improve the performance of the LFP battery pack and extend the life time of the LFP battery pack.

Figure 4:
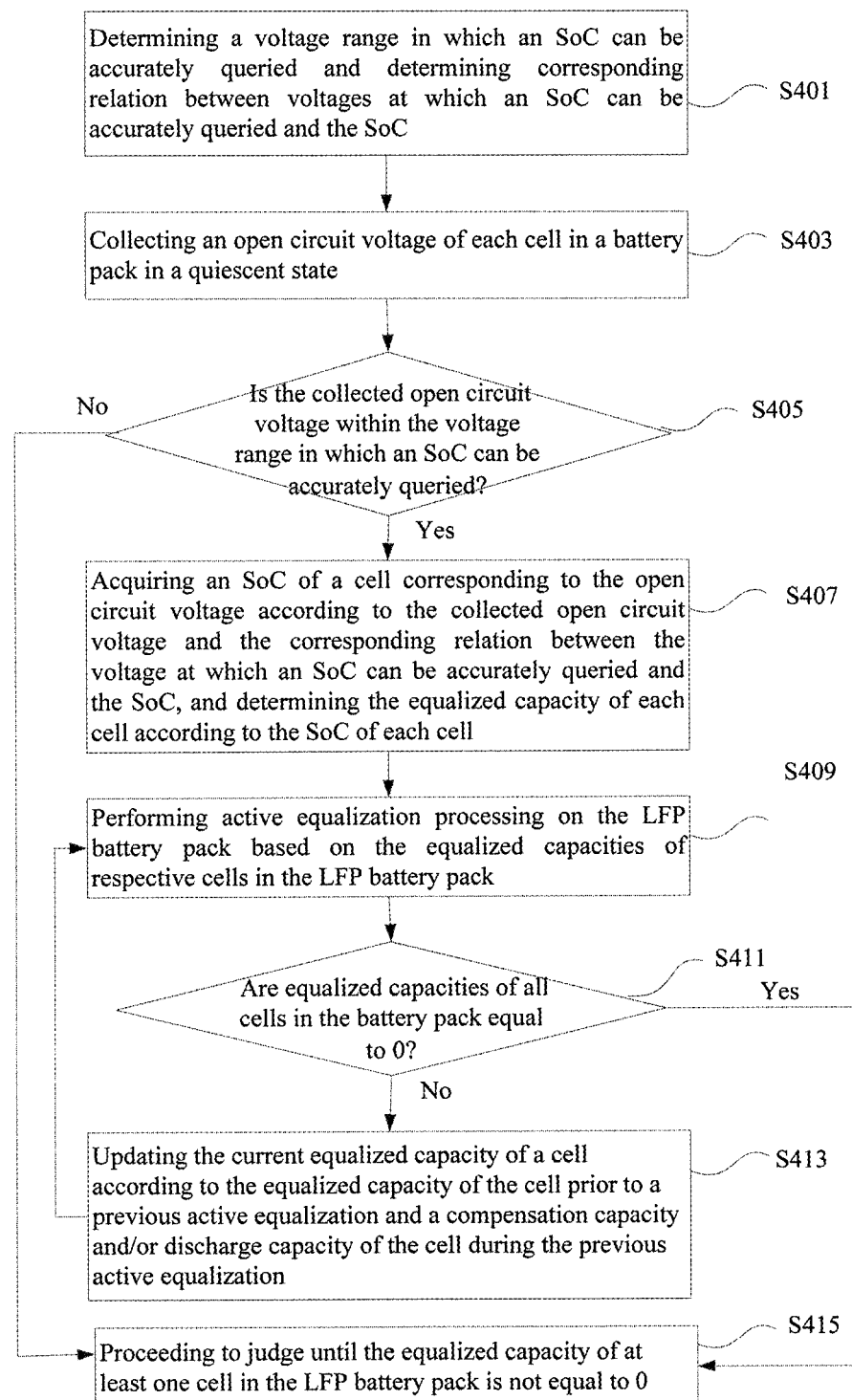
FIG. 4 is another flow chart of an active equalization method of an LFP battery pack according to an embodiment of the present invention.

FIG. 4 is another flow chart of an active equalization method of an LFP battery pack according to an embodiment of the present invention. As shown in FIG. 4, in the present embodiment, the active equalization method of an LFP battery pack may include the following steps:

steps S401 to S409 are the same as above steps S101 to S109, and the detailed description thereof will be omitted.

In step S411, whether the equalized capacities of respective cells are all 0 is judged at a predetermined interval such as 30 min or 1 hour, and if equalized capacities of all cells in the LFP battery pack are 0, proceed to step S415, otherwise, if there are cells whose equalized capacities are not 0, proceed to step S413;

in step 413, a current equalized capacity of a cell is updated according to an equalized capacity of the cell prior to a previous active equalization and a compensation capacity and/or discharge capacity of the cell during the previous active equalization, then proceed to step S409;

wherein the current equalized capacity of the cell=the equalized capacity of the cell prior to the previous active equalization+the compensation capacity of the cell during the previous active equalization−the discharge capacity of the cell during the previous active equalization.

When the step S409 is implemented after the equalized capacity of the cell is updated, the equalized capacity of the cell in step S409 refers to the updated equalized capacity.

In step S415, the equalization ends.

In the active equalization method of an LFP battery pack according to embodiments of the present invention, the current equalized capacity of each cell is updated through practical compensation capacity and/or discharge capacity of the cell, and thus it is possible to avoid reduce in performance of or damage to the LFP battery pack caused by over-charging or over-discharging, thereby further improving the performance of the LFP battery pack and extending the life time of the LFP battery pack.

Figure 5:
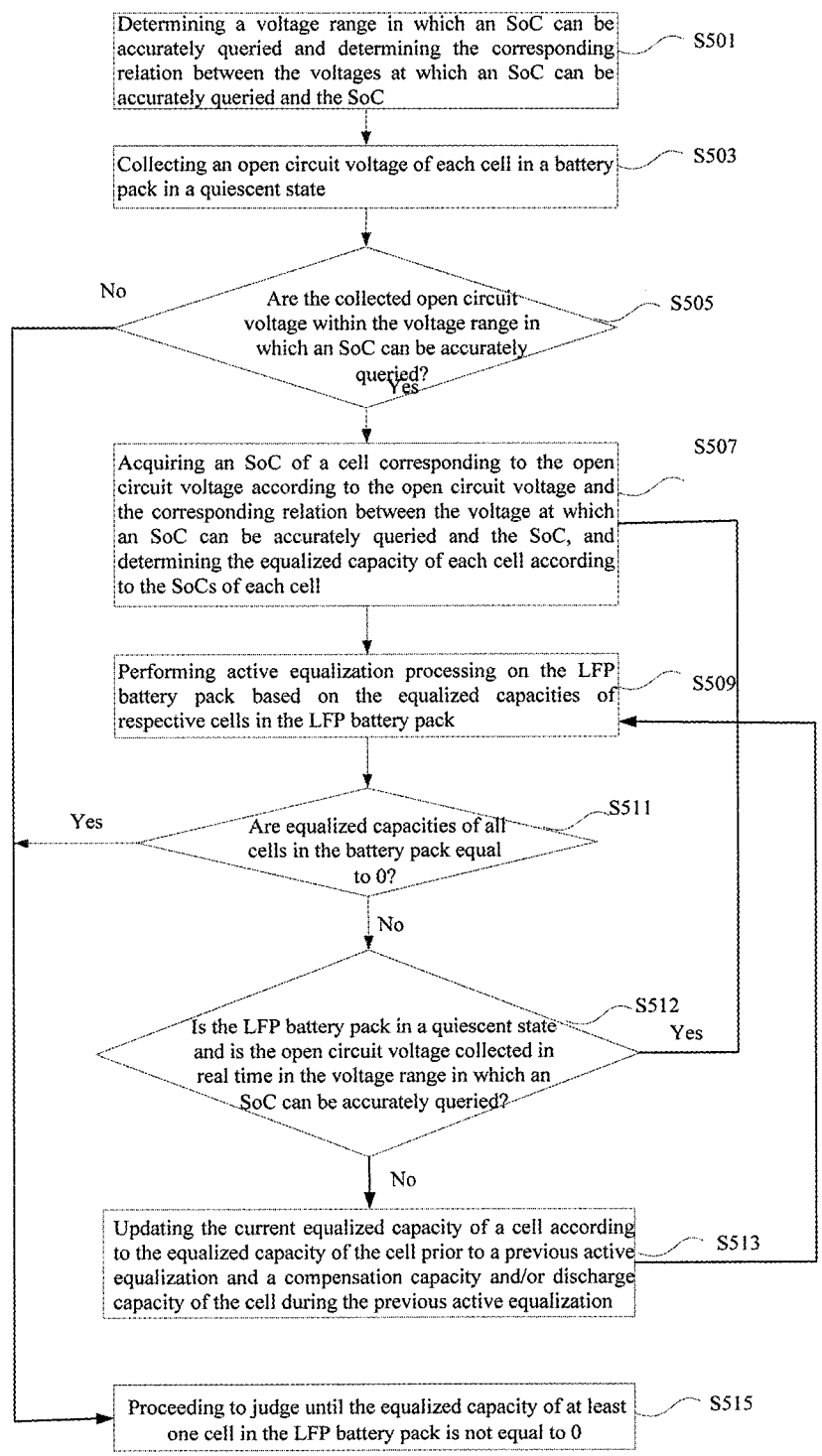
FIG. 5 is still another flow chart of an active equalization method of an LFP battery pack according to an embodiment of the present invention.

FIG. 5 is still another flow chart of an active equalization method of an LFP battery pack according to an embodiment of the present invention. As shown in FIG. 5, in the present embodiment, the active equalization method of an LFP battery pack may include the following steps:

steps S501 to S509 are the same as above steps S101 to S109, and the detailed description thereof will be omitted;

in step S511, whether the equalized capacities of respective cells are 0 is judged at a predetermined interval such as 30 min or 1 hour, and if equalized capacities of all cells in the LFP battery pack are 0, proceed to step S515, otherwise, if there are cells whose equalized capacities are not 0, proceed to step S512;

in step S512, whether the LFP battery pack is in a quiescent state and whether open circuit voltage sampled in real time is in the voltage range in which an SoC can be accurately queried are judged, and if the LFP battery pack is in a quiescent state and the open circuit voltage sampled in real time is in the voltage range in which an SoC can be accurately queried, proceed to step S507, otherwise, if the LFP battery pack is not in the quiescent state or the open circuit voltage sampled in real time is not in the voltage range in which an SoC can be accurately queried, proceed to step S513;

in step S513, a current equalized capacity of a cell is updated according to an equalized capacity of the cell prior to a previous active equalization and a compensation capacity and/or discharge capacity of the cell during the previous active equalization, then proceed to step S509;

in step S515, the equalization ends.

In the active equalization method of an LFP battery pack according to embodiments of the present invention, judging is performed at a predetermined interval such as 30 min or 1 hour, the equalized capacity of each cell is newly determined based on corresponding relation between the voltage at which SoC can be accurately queried and the SoC or the current equalized capacity of the cell is updated according to practical compensation capacity and/or discharge capacity of each cell, therefore it is possible to avoid any reduce in performance of or damage to the LFP battery pack caused by over-charging or over-discharging, thereby further improving the performance of the LFP battery pack and extending the life time of the LFP battery pack.

The active equalization method of an LFP battery pack according to the present invention will be further described through an example in a practical application scenario.

In the specific example, the following steps are included:

step a, sampling in real time, through a Battery Management System (BMS), voltages of cells in an LFP battery pack, and in a quiescent state, if voltages of all cells fall into the voltage range in which an SoC can be accurately queried, obtaining the SoC of each cell according to corresponding relation between the voltage at which an SoC can be accurately queried and the SoC, where the SoC of the $x^{th}$ cell is denoted as SoC(x) (x is a subscript that represents a cell, and the same hereinafter);

step b, selecting, from SoCs of all cells in the LFP battery pack, a minimum that is denoted as $SoC_{min}$, obtaining, from SoC(x) and $SoC_{min}$, an SoC difference between the SoC of each cell and the $SoC_{min}$, where the SoC difference of the $x^{th}$ cell is denoted as $\Delta SoC(x)$, and $\Delta SoC(x)=SoC(x)-SoC_{min}$;

step c, converting according to an equation: equalized capacity $\Delta Cap(x)$ of the $x^{th}$ cell=the rated capacity of the $x^{th}$ cell $*\Delta SoC(x)$, to obtain an equalized capacity $\Delta Cap(x)$ desired to be equalized for each cell, and recording $\Delta Cap(x)$, wherein the rated capacity of each cell is already known;

step d, dividing artificially the voltage of the entire LEP battery pack into a high voltage interval and a low voltage interval by taking the voltage threshold Vg as a dividing line, if an average voltage of cells in the LFP battery pack is greater than Vg, it is considered that the LFP battery pack is in the high voltage interval, otherwise, if the average voltage of cells in the LFP battery pack is smaller that Vg, it is considered that the LFP battery is in the low voltage interval;

step f, if the LFP battery pack is in the low voltage interval, performing compensation equalization on the M cells with smallest equalized capacities in the LFP battery pack, where M is a natural number; if the LFP battery pack is in the high voltage interval, performing compensation equalization on the M cells with smallest equalized capacities in the LFP battery pack and/or performing discharge equalization on Q cells with greatest equalized capacities in the LFP battery pack, where Q is a natural number, in which case current regulation requirements of an external power supply need to be met.

Figure 6:
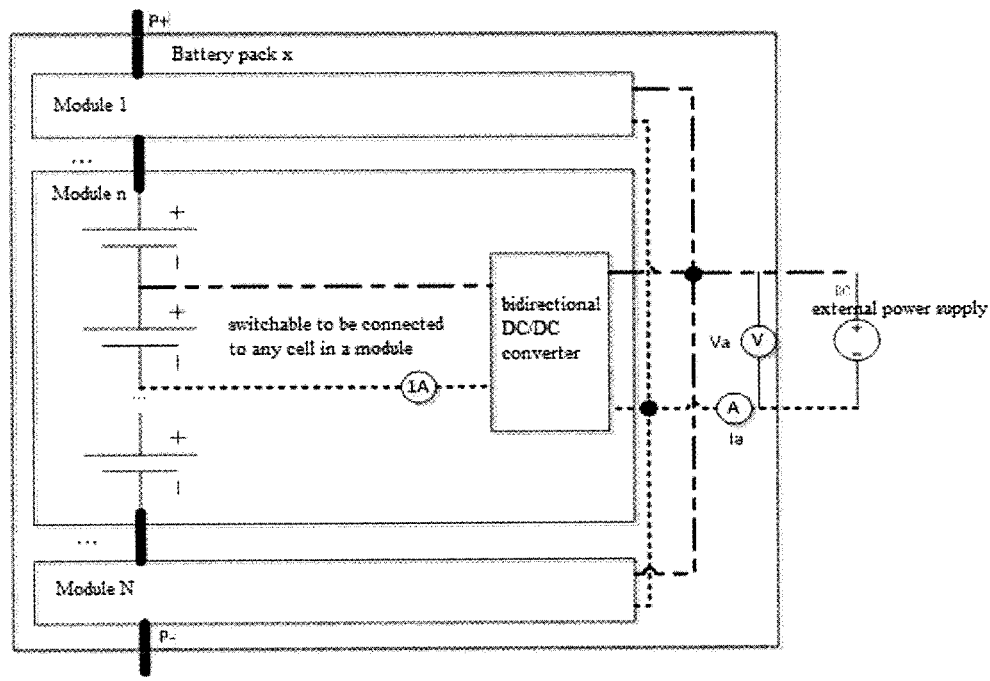
FIG. 6 is a schematic diagram of an active equalization circuit of an LFP battery pack according to an embodiment of the present invention.

The compensation equalization and the discharge equalization can be performed on cells of an LFP battery pack by using an equalization circuit shown in FIG. 6. FIG. 6 is a schematic diagram of an active equalization circuit of an LFP battery pack according to an embodiment of the present invention; In FIG. 6, the LFP battery pack is formed of multiple modules connected in series, and each module is formed of multiple cells connected in series. In each module, there is a bidirectional DC/DC converter that can be switched so as to be connected with any cell in the module. Energy bidirectional transfer is implemented between any cell in each module and an external power supply, a transfer of energy from the external power supply to a cell represents that the cell is compensated, and a transfer of energy from a cell to the external power supply means that the cell is discharged. Specifically, the external power supply can be a 12V or 24V lead-acid battery and can also be the LFP battery pack per se or the module per se. The circuit shown in FIG. 6 can also measure a current for equalized charging, a current for equalized discharging and a consumption current of an external power supply. There are no mutual constrains on mutual compensation equalization or discharge equalization between modules of the LFP battery pack.

step g, during the compensation equalization and discharge equalization processes, calculating the compensation capacity and discharge capacity of each cell;

step h, updating the current capacity $\Delta Cap(n)$ of a cell according to the practical compensation capacity and discharge capacity Capiece(n) of each cell at an interval (for example every 30 min or 1 hour), $\Delta Cap(n)=\Delta Cap(n)-Capiece(n)$, wherein if it is a compensation equalization, Capiece(n) is a negative value, if it is a discharge equalization, Capiece(n) is a positive value;

step i, re-calculating a minimum of $\Delta Cap(n)$, $\Delta Cap_{min}=\min(\Delta Cap(1),\Delta Cap(2), \Delta Cap(3) \ldots \Delta Cap(n))$, and re-calculating $\Delta Cap$ based on $\Delta Cap_{min}$: $\Delta Cap(n)=\Delta Cap(n)-\Delta Cap_{min}$;

step j, re-selecting a cell desired to be compensated and/or discharged according to an updated $\Delta Cap$, and performing corresponding compensation equalization and/or discharge equalization;

repeating steps g to j until all $\Delta Cap(n)$ are zero.

If SoC(x) of a cell is regained, steps a to c are repeated to obtain a new $\Delta Cap(x)$. If in a continuous quiescent state, a new value of SoC(x) can be acquired at intervals.

Figure 7:
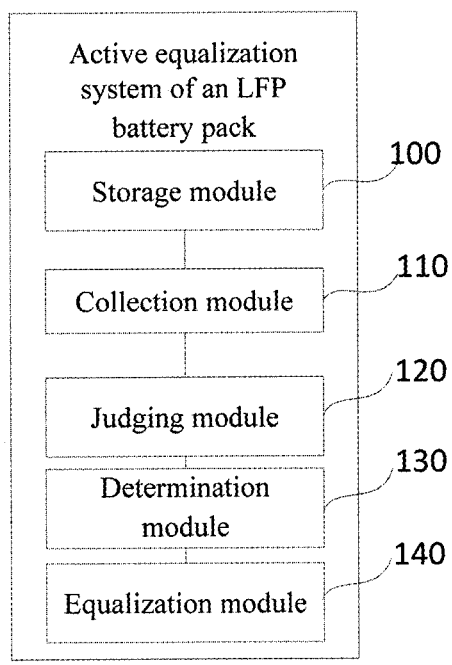
FIG. 7 is a structural block diagram of an active equalization system of an LFP battery pack according to an embodiment of the present invention.

FIG. 7 is a structural block diagram of an active equalization system of an LFP battery pack according to an embodiment of the present invention; As shown in FIG. 7, in the embodiment, the active equalization system of an LFP battery pack includes a storage module 100, a sampling module 110, a judging module 120, a determination module 130 and an equalization module 140.

Wherein, the storage module 100 is configured to store corresponding relations between voltages at which SoCs can be accurately queried and SoCs.

The sampling module 110 is configured to sample open circuit voltages of respective cells in the LFP battery pack in a quiescent state.

The judging module 120 is configured to judge whether the open circuit voltages are within the voltage range in which an SoC can be accurately queried. In an embodiment, the judging module 120 decides whether the current of the LFP battery pack is smaller than 0.03 Coulomb (C) or smaller than 3 Ampere (A) and lasts for more than 30 minutes (min); if the current of the LFP battery pack is smaller than 0.03 C or smaller than 3 A and lasts for more than 30 min, the judging module 120 determines that the LFP battery pack is in a quiescent state.

The determination module 130 is configured to, when an open circuit voltage is within the voltage range in which an SoC can be accurately queried, acquire an SoC of a cell corresponding to the open circuit voltage according to the open circuit voltage and the corresponding relation between the voltage at which an SoC can be accurately queried and the SoC, and determine the equalized capacity of each cell according to the SoCs of the cell, wherein the equalized capacity of each cell is equal to a difference between the capacity of each cell and a minimum of capacities of all cells in the LFP battery pack, and the capacity of a cell is equal to the product of a rated capacity of the cell and the SoC of the cell.

The equalization module 140 is configured to perform active equalization processing on the LFP battery pack based on the equalized capacities of respective cells in the LFP battery pack.

The active equalization system of an LFP battery pack according to embodiments of the present invention uses an accurate SoC difference as a basis for equalization, and carries out different equalization operations at two moments when the LFP battery pack is within a high voltage interval and a low voltage interval so that equalization decision and implementation are not necessarily to be carried out simultaneously. Furthermore, the active equalization system of an LFP battery pack according to embodiments of the present invention separates screening of decision basis from implementation of equalization operations so that reliability of the decision is improved and equalization can be implemented on any occasion. The active equalization system of an LFP battery pack according to embodiments of the present invention can improve the performance of the LFP battery pack and extend the life time of the LFP battery pack.

Figure 8:
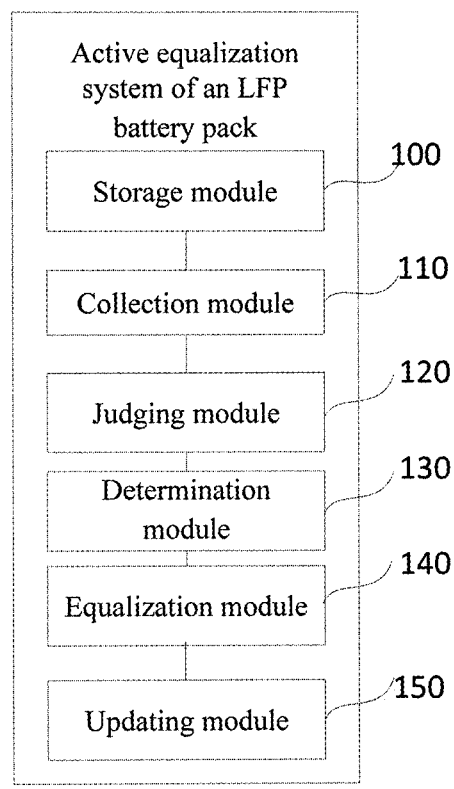
FIG. 8 is another structural block diagram of an active equalization system of an LFP battery pack according to an embodiment of the present invention.

FIG. 8 is another structural block diagram of an active equalization system of an LFP battery pack according to an embodiment of the present invention. As shown in FIG. 8, compared with the embodiment shown in FIG. 7, in the present embodiment, the active equalization system of an LFP battery pack may further include an updating module 150. The updating module 150 is configured to update a current equalized capacity of a cell according to an equalized capacity of the cell prior to a previous active equalization and a compensation capacity and/or discharge capacity of the cell during the previous active equalization, wherein the current equalized capacity of the cell=the equalized capacity of the cell prior to the previous active equalization+the compensation capacity of the cell during the previous active equalization–the discharge capacity of the cell during the previous active equalization.

Figure 9:
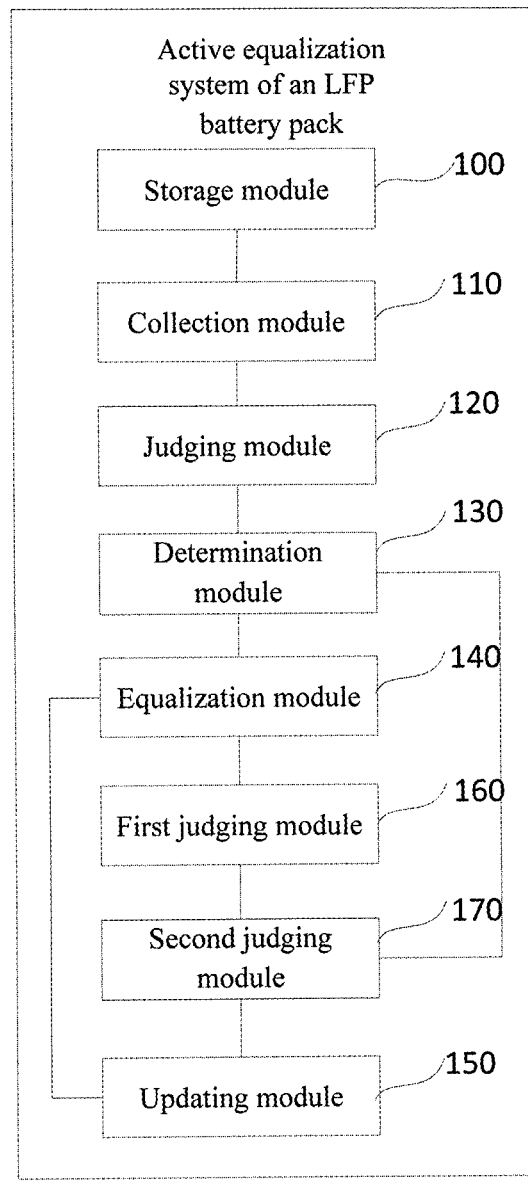
FIG. 9 is still another structural block diagram of an active equalization system of an LFP battery pack according to an embodiment of the present invention.

FIG. 9 is still another structural block diagram of an active equalization system of an LFP battery pack according to an embodiment of the present invention. As shown in FIG. 9, compared with the embodiment shown in FIG. 7, in the present embodiment, the active equalization system of an LFP battery pack may further include a first judging module 160, a second judging module 170 and an updating module 150. The first judging module 160 is connected with the equalization module 140 and is configured to judge whether equalized capacities of respective cells in the LFP battery pack are all equal to 0. The second judging module 170 is connected with the first judging module 160 and is configured to, when the judging result of the first judging module 160 is that the equalized capacity of at least one cell in the LFP battery pack is not equal to 0, decide whether the LFP battery pack is in a quiescent state and whether sampled open circuit voltages are within the voltage range in which an SoC can be accurately queried. The second judging module 170 is connected with the updating module 150 when the judging result is that the LFP battery pack is not in the quiescent state or the sampled open circuit voltages are not within the voltage range in which an SoC can be accurately queried. The second judging module 170 is connected with the determination module 130 when the judging result is that the LFP battery pack is in the quiescent state and the sampled open circuit voltages are within the voltage range in which an SoC can be accurately queried.

In the present embodiment of the present invention, the determination module 130 may further include an acquisition unit and a determination unit. Wherein, the acquisition unit is configured to acquire SoC differences of respective cells in the LFP battery pack. The SoC difference is equal to a difference between the SoC of a cell and a minimum SoC, and the minimum SoC is a minimum of SoCs of all cells in the LFP battery pack. The determination unit is configured to determine the equalized capacity of a cell according to the SoC difference. The equalized capacity is equal to a product of a rated capacity of the cell and the SoC difference of the cell.

In the present embodiment of the present invention, the equalization module 140 may further include a comparison unit, a first equalization unit and a second equalization unit. Specifically, the comparison unit is configured to compare an average voltage of the LFP battery pack with a preset voltage threshold. The first equalization unit is configured to, when the average voltage of the LFP battery pack is smaller than the voltage threshold, perform compensation equalization on M cells with smallest equalized capacities in the LFP battery pack, where M is a natural number. The second equalization unit is configured to, when the average voltage of the LFP battery pack is greater than the voltage threshold, perform compensation equalization on the M cells with smallest equalized capacities in the LFP battery pack, and/or perform discharge equalization on Q cells with greatest equalized capacities in the LFP battery pack, where Q is a natural number.

The active equalization system of an LFP battery pack according to the present invention is a system corresponding to the active equalization method of an LFP battery pack according to the present invention, and the description of principles regarding the active equalization method of an LFP battery pack according to the present invention is applicable to the active equalization system of an LFP battery pack according to the present invention.

The aforesaid is merely preferable embodiments of the present invention, and is not intended to limit the present invention. All modifications, replacements and improvements made within the spirit and principles of the present invention should be included within the scope of protection of the present invention.

The invention claimed is:

1. An active equalization method of a lithium iron phosphate (LFP) battery pack, comprising the following steps of:
   determining, for each cell in the LFP battery pack, a voltage range in which a State of Charge (SoC) can be accurately queried, and determining a corresponding relation between a voltage at which the SoC can be accurately queried and the SoC;
   sampling an open circuit voltage of each cell in the LFP battery pack in a quiescent state;
   judging whether the open circuit voltage is within the voltage range in which the SoC can be accurately queried;
   if the open circuit voltage is within the voltage range in which the SoC can be accurately queried, acquiring the SoC of a cell corresponding to the open circuit voltage according to the open circuit voltage and the corresponding relation between the voltage at which the SoC can be accurately queried and the SoC, and determining an equalized capacity of each cell according to the SoC of each cell, wherein the equalized capacity of a cell is equal to a difference between a capacity of each cell and a minimum of capacities of all cells in the LFP battery pack, and the capacity of a cell is equal to a product of a rated capacity of the cell and the SoC of the cell; and
   performing active equalization processing on the LFP battery pack based on the equalized capacities of respective cells in the LFP battery pack,
   wherein the active equalization method further comprises:
   updating a current equalized capacity of a cell according to an equalized capacity of the cell prior to a previous active equalization and a compensation capacity and/or discharge capacity of the cell during the previous active equalization, wherein the current equalized capacity of the cell=the equalized capacity of the cell prior to the previous active equalization+the compensation capacity of the cell during the previous active equalization−the discharge capacity of the cell during the previous active equalization;
   then the active equalization processing comprising: performing active equalization processing on the LFP battery pack based on updated current equalized capacity of the cell in the LFP battery pack.

2. The active equalization method of an LFP battery pack according to claim 1, wherein, before the step of updating a current equalized capacity of a cell according to an equalized capacity of the cell prior to a previous active equalization and a compensation capacity and/or discharge capacity of the cell during the previous active equalization, the active equalization method of an LFP battery pack further comprises:
   judging continuously whether the equalized capacities of respective cells in the LFP battery pack are all equal to 0, and if the equalized capacity of at least one cell in the LFP battery pack is not equal to 0, judging whether the LFP battery pack is in a quiescent state and whether the open circuit voltage sampled in real time is within the voltage range in which an SoC can be accurately queried; in a case where the equalized capacities of respective cells in the LFP battery pack are all equal to 0, proceeding to judge until the equalized capacity of at least one cell in the LFP battery pack is not equal to 0;
   if the LFP battery pack is not in a quiescent state or the open circuit voltage sampled in real time is not within the voltage range in which an SoC can be accurately queried, implementing the following step of: updating a current equalized capacity of a cell according to an equalized capacity of the cell prior to a previous active equalization and a compensation capacity and/or discharge capacity of the cell during the previous active equalization.

3. The active equalization method of an LFP battery pack according to claim 2, wherein further comprising:
   if the LFP battery pack is in a quiescent state and the open circuit voltage sampled in real time is not within the voltage range in which an SoC can be accurately queried, implementing the following steps of: acquiring an SoC of a cell corresponding to an open circuit voltage sampled in real time according to the open circuit voltage sampled in real time and the corresponding relation between a voltage at which the SoC can be accurately queried and the SoC, and determining the equalized capacity of each cell according to the SoC of each cell corresponding to the open circuit voltage sampled in real time.

4. The active equalization method of an LFP battery pack according to claim 1, wherein, the step of determining equalized capacity of each cell according to the SoC of each cell comprises the following steps of:

acquiring an SoC difference of each cell in the LFP battery pack, wherein the SoC difference is equal to a difference between the SoC of a cell and a minimum SoC, and the minimum SoC is a minimum of SoCs of all cells in the LFP battery pack;

determining the equalized capacity of a corresponding cell according to the SoC difference, wherein the equalized capacity of the cell is equal to a product of a rated capacity of the cell and the SoC difference of the cell.

5. The active equalization method of an LFP battery pack according to claim 1, wherein, the step of performing active equalization processing on the LFP battery pack based on the equalized capacity of each cell in the LFP battery pack includes:

comparing an average voltage of the LFP battery pack with a preset voltage threshold;

if the average voltage of the LFP battery pack is smaller than the voltage threshold, performing compensation equalization on M cells with smallest equalized capacities in the LFP battery pack, where M is a natural number;

if the average voltage of the LFP battery pack is greater than the voltage threshold, performing compensation equalization on the M cells with the smallest equalized capacities in the LFP battery pack, and/or performing discharge equalization on Q cells with the greatest equalized capacities in the LFP battery pack, where Q is a natural number.

6. The active equalization method of an LFP battery pack according to claim 1, wherein, the voltage range in which an SoC can be accurately queried is a union set of a voltage interval from 2710 mV to 3283 mV and a voltage interval from 3299 mV to 3317 mV.

7. An active equalization system of a lithium iron phosphate (LFP) battery pack, comprising a storage module, a sampling module, a judging module, a determination module and an equalization module, wherein, the storage module is configured to store a corresponding relation between a voltage at which an States of Charge (SoC) can be accurately queried and the SoC;

the sampling module is configured to sample an open circuit voltage of each cell in the LFP battery pack in a quiescent state;

the judging module is configured to judge whether the open circuit voltage is within a voltage range in which the SoC can be accurately queried;

the determination module is configured to acquire an SoC of a cell corresponding to the open circuit voltage according to the open circuit voltage and the corresponding relation between a voltage at which the SoC can be accurately queried and the SoC when the open circuit voltage is within the voltage range in which the SoC can be accurately queried, and determine an equalized capacity of each cell according to the SoC of each cell, wherein the equalized capacity of each cell is equal to a difference between a capacity of each cell and a minimum of capacities of all cells in the LFP battery pack, and the capacity of a cell is equal to a product of a rated capacity of the cell and the SoC of the cell;

the equalization module is configured to perform active equalization processing on the LFP battery pack based on the equalized capacities of respective cells in the LFP battery pack, wherein the active equalization system further comprises an updating module configured to update a current equalized capacity of a cell according to an equalized capacity of the cell prior to a previous active equalization and a compensation capacity and/or discharge capacity of the cell during the previous active equalization, wherein the current equalized capacity of the cell=the equalized capacity of the cell prior to the previous active equalization+the compensation capacity of the cell during the previous active equalization−the discharge capacity of the cell during the previous active equalization; the equalization module is further configured to perform active equalization processing on the LFP battery pack based on updated current equalized capacities of respective cells in the LFP battery pack.

8. The active equalization system of an LFP battery pack according to claim 7, further comprising:

a first judging module configured to judge continuously whether the equalized capacities of respective cells in the LFP battery pack are all equal to 0;

a second judging module configured to, when a judging result of the first judging module is that the equalized capacity of at least one cell in the LFP battery pack is not equal to 0, judge whether the LFP battery pack is in a quiescent state and whether the open circuit voltage sampled in real time is within the voltage range in which an SoC can be accurately queried; and when the judging result of the second judging module is that the LFP battery pack is not in a quiescent state or the open circuit voltage sampled in real time is not within the voltage range in which an SoC can be accurately queried, notify the updating module to update the current equalized capacity of the cell according to the equalized capacity of the cell prior to the previous active equalization and the compensation capacity and/or discharge capacity of the cell during the previous active equalization.

9. The active equalization system of an LFP battery pack according to claim 8, wherein, the second judging module is configured to, when the judging result is that the LFP battery pack is in a quiescent state and the open circuit voltage sampled in real time is not within the voltage range in which an SoC can be accurately queried, notify the determination module to acquire the SoC of a cell corresponding to the open circuit voltage sampled in real time according to the open circuit voltage sampled in real time and the corresponding relation between the voltages at which the SoC can be accurately queried and the SoC, and to determine the equalized capacity of each cell according to the SoC of each cell corresponding to the open circuit voltage sampled in real time.

10. The active equalization system of an LFP battery pack according to claim 7, the determination module comprises:

an acquisition unit configured to acquire an SoC difference of each cell in the LFP battery pack, wherein the SoC difference is equal to a difference between the SoC of each cell and a minimum SoC, and the minimum SoC is a minimum of SoCs of all cells in the LFP battery pack;

a determination unit configured to determine, according to each of the SoC differences, the equalized capacity of a corresponding cell, which is equal to a product of a rated capacity of the cell and the SoC difference of the cell.

11. The active equalization system of an LFP battery pack according to claim 7, wherein, the equalization module comprises:

a comparison unit configured to compare an average voltage of the LFP battery pack with a preset voltage threshold;

a first equalization unit configured to, when the average voltage of the LFP battery pack is smaller than the voltage threshold, perform compensation equalization on M cells with smallest equalized capacities in the LFP battery pack, wherein M is a natural number;

a second equalization unit configured to, when the average voltage of the LFP battery pack is greater than the voltage threshold, perform compensation equalization on the M cells with smallest equalized capacities in the LFP battery pack, and/or perform discharge equalization on Q cells with greatest equalized capacities in the LFP battery pack, wherein Q is a natural number.

12. The active equalization system of an LFP battery pack according to claim 7, wherein, the voltage range in which an SoC can be accurately queried is a union set of a voltage interval from 2710 mV to 3283 mV and a voltage interval from 3299 mV to 3317 mV.

* * * * *